(12) United States Patent
Yamamoto et al.

(10) Patent No.: US 7,259,438 B2
(45) Date of Patent: Aug. 21, 2007

(54) SOLID STATE IMAGING DEVICE AND PRODUCING METHOD THEREOF

(75) Inventors: Kiyofumi Yamamoto, Kanagawa (JP); Kazuhiro Nishida, Kanagawa (JP)

(73) Assignee: Fujifilm Corporation, Tokyo (JP)

(*) Notice: Subject to any disclaimer, the term of this patent is extended or adjusted under 35 U.S.C. 154(b) by 0 days.

(21) Appl. No.: 10/992,776

(22) Filed: Nov. 22, 2004

(65) Prior Publication Data

US 2005/0110107 A1    May 26, 2005

(30) Foreign Application Priority Data

Nov. 25, 2003   (JP)   ............... 2003-394221

(51) Int. Cl.
H01L 31/0203   (2006.01)
(52) U.S. Cl. ...................... 257/433; 257/432
(58) Field of Classification Search ......... 257/431–470
See application file for complete search history.

(56) References Cited

U.S. PATENT DOCUMENTS 6,453,126 B1 * 9/2002 Abe ........................... 396/429
6,930,327 B2 * 8/2005 Maeda et al. ................ 257/434

FOREIGN PATENT DOCUMENTS

| JP | 8-5566 Y2 | 2/1996 |
| JP | 2001-351997 A | 12/2001 |

* cited by examiner

*Primary Examiner*—Cuong Nguyen
(74) *Attorney, Agent, or Firm*—Sughrue Mion, PLLC

(57) ABSTRACT

A semiconductor substrate of a solid state imaging device is connected to a cover glass, and then a backgrind is performed so as to make the thickness smaller. On a first face of the semiconductor substrate is formed plural units which is constructed of image sensors and plural contact terminals. At positions of the contact terminals, plural through-holes are formed on the bottom side of the semiconductor substrate, and the contact terminals appear on a second surface of the semiconductor substrate. On an interconnection circuit pattern of the assembly substrate are formed stud bumps. When the semiconductor substrate is assembled onto the assembly substrate, the stud bumps enter into the through-holes to contact to the contact terminals. Thus the interconnection circuit pattern is electrically connected to the image sensors.

9 Claims, 15 Drawing Sheets

FIG.4

| PROCESS | | TREATMENT | | |
|---|---|---|---|---|
| | | HTT | VT | WT |
| FIRST OPERATION: JOINING WAFER & GLASS SUBSTRATE | APPLYING, PRESSING & HARDENING ADHESIVE AGENT | | | |
| SECOND OPERATION: DECREASING WAFER THICKNESS | BACKGRIND | | | * |
| THIRD OPERATION: FORMING THROUGH HOLES | 1. PHOTOLITHOGRAPHY /MASK FORMATION | * | | * |
| | 2. PLASMA ETCHING | | * | |
| | 3. ASHING/MASK REMOVAL | * | * | |
| FOURTH OPERATION: CUTTING WAFER | DICING | | | * |
| FIFTH OPERATION: FORMATING BUMPS | WIRE BONDER | * | | |
| SIXTH OPERATION: ASSEMBLING ON ASSEMBLY SUBSTRATE | APPLYING, BONDING & HARDENING INSULATION ADHESIVE AGENT | * | | |

HTT: HIGH TEMPERATURE TREATMENT
VT: VACUUM TREATMENT
WT: WET TREATMENT

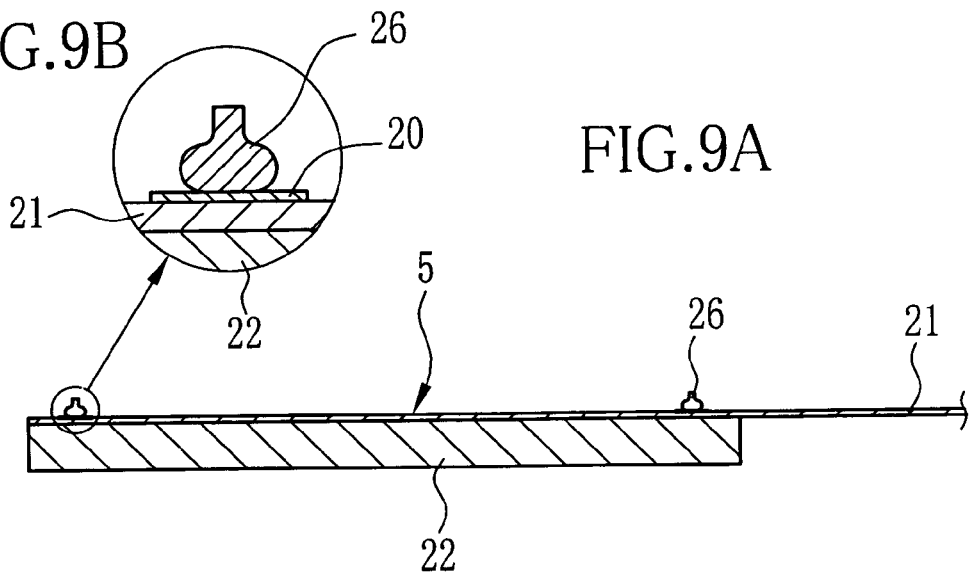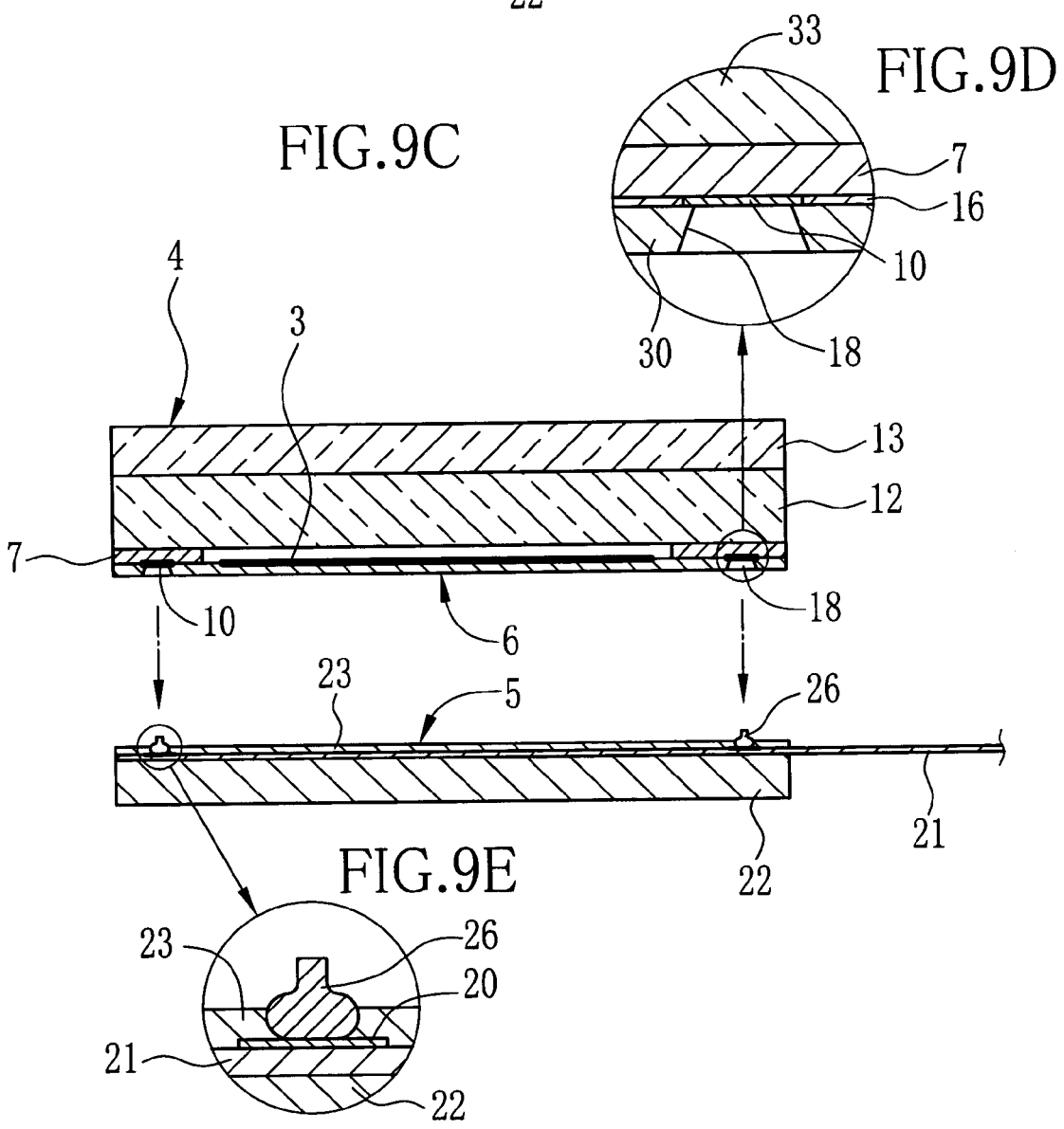

FIG.12

| PROCESS | | TREATMENT | | |
|---|---|---|---|---|
| | | HTT | VT | WT |
| FIRST OPERATION: JOINING WAFER AND GLASS SUBSTRATE | APPLYING, PRESSING & HARDENING ADHESIVE AGENT | | | |
| SECOND OPERATION: DECREASING WAFER THICKNESS | BACKGRIND | | | * |
| THIRD OPERATION: FORMING THROUGH HOLES | 1. PHOTOLITHOGRAPHY /MASK FORMATION | * | | * |
| | 2. PLASMA ETCHING | | * | |
| | 3. ASHING/MASK REMOVAL | * | * | |
| FOURTH OPERATION: FORMING BUMPS | WIRE BONDER | * | | |
| FIFTH OPERATION: FORMING INSULATION LAYER | 1. APPLYING & HARDENING INSULATION ADHESIVE AGENT | * | | |
| | 2. GRINDING & POLISHING DEVICE /PROTRUDING HEADS OF BUMPS | | | * |
| SIXTH OPERATION: FORMING PATTERN OF INTERCONNECTION | 1. PHOTOLITHOGRAPHY /MASK FORMATION | * | | * |
| | 2. ELECTROLESS METAL DEPOSITION | | | * |
| | 3. MASK REMOVAL | | | * |
| SEVENTH OPERATION: CUTTING WAFER | DICING | | | * |

FIG.15
(PRIOR ART)

| PROCESS | | TREATMENT | | |
|---|---|---|---|---|
| | | HTT | VT | WT |
| FIRST OPERATION: JOINING WAFER & GLASS SUBSTRATE | APPLYING, PRESSING & HARDENING ADHESIVE AGENT | | | |
| SECOND OPERATION: FORMING THROUGH HOLES | 1. PHOTOLITHOGRAPHY /MASK FORMATION | * | | * |
| | 2. PLASMA ETCHING | | * | |
| | 3. ASHING/MASK REMOVAL | * | * | |
| THIRD OPERATION: FORMING INSULATION LAYER ON WALLS OF THROUGH HOLES | CHEMICAL VAPOR DEPOSITION | * | * | |
| FOURTH OPERATION: REMOVING INSULATION LAYER FROM TOP WALLS OF THROUGH HOLES | 1. PHOTOLITHOGRAPHY /MASK FORMATION | * | | * |
| | 2. PLASMA ETCHING | | * | |
| | 3. ASHING/MASK REMOVAL | * | * | |
| FIFTH OPERATION: FORMING THROUGH HOLE INTERCONNECTIONS | 1. VACUUM SCREEN PRINTING | | * | |
| | 2. HARDENING CONDUCTIVE PASTE IN HEAT | * | | |
| | 3. BACKGRIND | | | * |
| SIXTH OPERATION: FORMING INSULATION LAYER ON BOTTOM | 1. PLASMA ETCHING | | * | |
| | 2. APPLYING & HARDENING INSULATION ADHESIVE AGENT | * | | |
| | 3. BACKGRIND | | | * |
| SEVENTH OPERATION: FORMING CONNECTION TERMINAL & INTERCONNECTION PATTERN | 1. PHOTOLITHOGRAPHY /MASK FORMATION | * | | * |
| | 2. ELECTROLESS METAL DEPOSITION | | | * |
| | 3. MASK REMOVAL | | | * |
| EIGHTH OPERATION: CUTTING WAFER | DICING | | | * |

SOLID STATE IMAGING DEVICE AND PRODUCING METHOD THEREOF

BACKGROUND OF THE INVENTION

1. Field of the Invention

The present invention relates to a solid state imaging device with a wafer-level chip size package, and more particularly to a solid state imaging device in which a wiring is extended to an opposite surface to a photoelectric conversion surface, and a producing method of the solid state imaging device.

2. Description Related to the Prior Art

A digital video camera and a video camera with use of solid state imaging device (such as CCDs, CMOS type and the like) is in wide spread use. Further, an electronic apparatus (a personal computer, a mobile phone, an electronic notepads or the like) includes a solid state imaging device and a memory to have an image-taking function. Since having a large influence on an outer size of a digital camera or an electronic apparatus with the image-taking function, the solid state imaging device is required to be small.

In order to make the solid state imaging device smaller, the solid state imaging device utilizing a packaging method called a chip size package (hereinafter CSP) is invented (for example, Japanese Utility Model Publication No. 08-005566). In the CSP method, at first, plural image sensors are formed with a matrix arrangement on the wafer in semiconductor wafer process. Then the dicing of the wafer is made, and the wafer is cut to the bare chips having respective image sensor. The bare chip is assembled on an assembly substrate, and thereafter packaged by a plastic, such that the solid state imaging device may be obtained. The obtained solid state imaging device is as large as or slightly larger than the bare chip.

Further, the solid state imaging device utilizing a wafer-level chip size package (hereinafter WLCSP) is invented to enable smaller packaging than the CSP (for example, Japanese Patent Laid-Open Publication No. 2001-351997). In the solid state imaging device with the WLCSP whose packaging is complete is obtained by making a dicing of the wafer after the image sensor are fixed with the packaging and the connection terminals are formed in the semiconductor wafer process.

The solid state imaging device of the CSP type or the WLCSP type is assembled on a printed circuit with adhesion, and a connection terminals formed on an upper face of the solid state imaging device is connected through a bonding wire to the printed circuit board. However, in this case, the assembling size actually becomes large. Accordingly, in the solid state imaging device of the above two publications No. 08-005566 and 2001-351997, the connection terminals are formed on a lower surface by through-hole interconnections and the face bonding to the assembly substrate or the printed circuit board is made.

In the above solid state imaging device of the two publications, the through-hole interconnections are formed before the bare chip are packaged with resin or a cover glass. Accordingly, dusts and cruds are easily adhered onto the imaging elements, and the production yield becomes lower. In order to solve the problems, the through-hole interconnections may be formed after the bare chip are packaged. In followings, a method of producing the solid state imaging device having the through-hole interconnections is simply explained.

For example, a solid state imaging device 100 shown in FIGS. 14A, 14B has a semiconductor substrate 103 whose upper surface is provided with image sensor 101 and contact terminals 102, and a cover glass 105 for packaging the upper face of the semiconductor substrate (sensor chip) 103 inserting a spacer 104 between the semiconductor substrate 103 and the cover glass 105. The semiconductor substrate 103 has through-hole interconnections 107 for connecting a contact terminal 102 on its upper surface to a connection terminal 106 on its lower surface. Between the semiconductor substrate 103 and the through-hole interconnections 107 and between the semiconductor substrate 103 and the connection terminal 106 are respectively provided an insulation layer 117 for insulating a side wall and an insulating layer 122 for insulating a bottom.

In the table of FIG. 15, the production process of the prior solid state imaging device 100 and a concrete content of operations in each process, and a treatment content made in each operation. The treatment content is distinguished to a high temperature treatment under high temperature, a vacuum treatment under the vacuum condition, and a wet treatment made with use of a liquid. The treatment made in each process is marked with an asterisk.

In a first process for producing the solid state imaging device 100, a joint of a wafer and a glass substrate is made. As shown in FIGS. 16A & 16B, a wafer 110 is obtained by forming plural image sensors 101 and the contact terminals 102 on the well-known silicone wafer in the semiconductor wafer process. The wafer 110 is cut into each image sensor 101 to be the semiconductor substrate (sensor chip) 103. Further, a glass substrate 111 is a substrate of the cover glass 105, and cut together with the wafer 110 to be the cover glasses 105. To a bottom of the glass substrate 111 is connected to a spacer substrate 112, which is cut in the same manner to be the spacer 104.

In order to join the wafer 110 and the glass substrate 111, an adhesive agent is applied to the spacer substrate 112. After the deposition of the spacer substrate 112 on the wafer 10, they are pressed to make the adhesion and the adhesive agent is solidified. Thus, since the image sensors are packaged by the glass substrate 111 and the spacer substrate 112, the dust does not adhere to the image sensor 101 in the following process. Note that a chain double dashed line X in this figure illustrates positions for cutting the wafer 110 and the glass substrate 111 at each image sensor 101.

In a second process, through-holes are formed. As shown in FIGS. 16C & 16D, through-holes 115 are formed on a bottom of the wafer 110 so as to confront each contact terminal 102. At first, in the portions not forming the through-holes on the bottom, a resist mask is formed by a photolithography. Then the through-holes 115 are formed on the wafer 110 by the plasma etching. Through the through-holes 115, a bottom of each contact terminal 102 is exposed. The resist mask is removed by ashing.

In the third process, the insulating layer 117 is formed on a side wall of the through-holes 115. The insulating layer 117 is formed in a chemical vapor deposition. As shown in FIG. 17A, the insulating layer 117 is formed on the contact terminal 102 exposed in the through-holes 115, and therefore prevents the conduction between the contact terminal and a conductive paste filled in the through-holes 115. Accordingly, in the fourth process, the insulation layer 117 on the contact terminal 102 is removed. In the removal of the insulation layer 117, a resist mask is formed on the bottom of the wafer 110 by a photolithography, and then the plasma etching is made to remove only the insulation layer 117 on the contact terminal which is not masked, as shown in FIG. 17B. The resist mask is removed by ashing.

In the fifth process, the through-holes 115 are filled with a conductive paste for forming the through-hole interconnections 107. The filling of the conductive paste is made by a vacuum screen printing. Then the conductive paste in the through-hole 115 is hardened by heating the wafer 110. Note that the conductive paste filled by the vacuum screen printing forms a dent on the bottom of the wafer 110. In order to modify the dent, the grinding and the polishing, namely the backgrind, is made. In the backgrind, the insulating layer 117 on the bottom of the wafer 110 is removed.

In the sixth process, an insulating layer 122 is formed on whole of the bottom of the wafer 110. At first, the plasma etching is made to whole of bottom of the wafer 110 such that the through-hole interconnections may project from the bottom as shown in FIG. 17C. Then an insulating adhesive agent is applied to a bottom of the wafer 110, and solidified with heating so as to form the insulating layer 122 in FIG. 17D. Since the insulating layer 122 is formed also on the through-hole interconnections 107, the backgrind is made again such that the through-hole interconnections 107 may be exposed from the insulation layer 122.

In a seventh process, the connection terminal 106 is formed on the insulating layer 122. In this process, a resist mask is formed on the bottom of the wafer 110 by the photolithography, and the bottom and a side of the wafer 110 is dipped into a plating solution to make an electroless deposition, such that the connection terminal 106 may be formed. In the last operation, the solution and the like are used for the removal of the resist mask. In a last eighth process, the dicing of the wafer 110 and he glass substrate 111 connected thereto is made at the position of the chain double dashed line X. The solid state imaging device 100 of the WLCSP illustrated in FIG. 14 is completed.

In order to form the through-hole interconnections in the solid state imaging device, a high-temperature treatment, a vacuum treatment, a wet treatment and the like are made many times as described above, for example a plasma etching, the ashing, a formation of the insulating layer, and the backgrind and the like. Thus, the number of the expensive operations and the total processes or operations in the production line becomes increased. Accordingly, the solid state imaging device becomes expensive.

Further, the solid state imaging device of the CSP structure or the WLCSP structure becomes small, and therefore the pitch of interconnection is short. As a result, the aspect ratio of the through-hole interconnection is high. In this case, the through-hole interconnections easily have voids caused by insufficient supply of the conductive paste, and the voids change the resistance. Especially in the solid state imaging device, the change of the resistance of the through-hole interconnection disrupts the output waveform, and the image quality became worse.

SUMMARY OF THE INVENTION

An object of the present invention is to provide a solid state imaging device, in which interconnections can be exposed on a bottom of the semiconductor substrate in a low cost.

In order to achieve the object and the other object, a solid state imaging device of the present invention includes a semiconductor substrate having first and second faces, a translucent member superimposed on the first face of the semiconductor substrate, and an assembly substrate for assembling the semiconductor substrate thereon. The first face of the semiconductor substrate is provided with plural image sensors and plural contact terminals connected to the respective image sensors. The each contact terminal appears through the through-holes formed by piercing from a side of the second face. As the translucent member is superimposed on the first face of the semiconductor substrate, the image sensors and the contact terminals are sealed. In the solid state imaging device, plural bumps are formed in at least one of the semiconductor substrate and the assembly substrate for connecting the contact terminal in the each through-hole to the assembly substrate.

Another embodiment of a solid state imaging device of the present invention includes a semiconductor substrate having first and second faces, a translucent member superimposed on the first face of the semiconductor substrate, and an assembly substrate for assembling the semiconductor substrate thereon. The first face of the semiconductor substrate is provided with plural image sensors and plural contact terminals connected to the respective image sensors. The each contact terminal appears through the through-holes on the second face of the semiconductor substrate. As the translucent member is superimposed on the first face of the semiconductor substrate, the image sensors and the contact terminals are sealed. In the solid state imaging device, plural bumps are positioned in the respective through-holes for connecting the contact terminal in each through-hole and the connection terminal.

Further when a pattern of peripheral circuitry is formed on the second face, electric parts for the peripheral circuitry can be assembled.

Furthermore, a space is formed between the image sensor and the translucent member. The translucent member is one of a low-α-ray glass, IR-cut filter and a low path filter. The translucent member is attached to the semiconductor substrate through the spacer, whose material is one of stainless and silicon. The semiconductor substrate is from 30 to 100 μm in thickness.

In a producing method of a solid state imaging device of the present invention, plural units constructed of plural image sensors and plural contact terminals respectively connected to the image sensors are formed on a first face of a wafer. A translucent substrate is joined onto the first face of the wafer to seal the image sensor and the contact terminals. In the wafer, plural through-holes are formed from a side of the second face such that the plural contact terminals may appear on the second face. The joined wafer and the translucent substrate are cut at each of the units such that plural semiconductor substrates may be obtained, each of which has the image sensors. Bumps are formed on an assembly substrate, on which the semiconductor substrate is assembled so as to contact the contact terminal in the each through-hole to the assembly substrate through the bump.

In a preferable embodiment of a producing method of the present invention, plural units constructed of plural image sensors and plural contact terminals respectively connected to the image sensors are formed on a first face of a wafer. A translucent substrate is joined onto the first face of the wafer to seal the image sensor and the contact terminals. In the wafer, plural through-holes are formed from a side of the second face such that the plural contact terminals may appear on the second face. Bumps are formed in the respective through-holes. Plural connection terminals are formed on the second face of the wafer so as to connect the connection terminal and the contact terminals through the bumps. Them the joined wafer and translucent substrate are cut for each image sensor.

Further, when a pattern of a peripheral circuitry is formed on the second face of the wafer, electric parts for the peripheral circuitry can be assembled on the pattern.

According to the solid state imaging device and a producing method thereof, since the bumps are used instead of through-hole interconnections, the deterioration of the image quality caused by the voids in the through-hole interconnections does not occur. Further, the operations of the high cost, for example the insulation layer in the through-hole, the remove of the insulation layer on the contact terminal, vacuum screen print and the like can be omitted, the number of the operations can be reduced and the solid state imaging device can be produced in low cost.

Further, since the grinding of the wafer is made before forming the through-holes, the thickness of the solid state imaging device can be decreased. Further, since the etching for forming the through-holes can be completed in a sort time, the productivity becomes higher, the cost becomes lower, and the side etch is prevented. If the grinding of only the wafer is made, the strength extremely decreases, and therefore the handling and the like are difficult. However, since the grinding of the wafer joined to the translucent substrate, the strength can be kept enough for the handling.

Further, since a DSP chip and the like can be assembled with face down, the apparatus in which the solid state imaging device is used can become smaller. Further, since the contact terminals are sealed by the translucent member, the width of sealing becomes larger. Therefore the sealing effective increases.

Since there is a space between the image sensor and the translucent member, the solid state imaging device is provided with micro lenses above respective pixels having photoelectric function, and the effectives of the micro lenses don't become lower. Further, the said translucent member is one of a low-α-ray glass, IR-cut filter and a low path filter, an space and works for attachment can be made smaller than when they are separately attached. Further, since a spacer is disposed between the translucent member and the semiconductor substrate, the sealing can be made by forming a gap above the image sensor, instead of processing, such as forming the recess of the translucent member. Further, since a material of the spacer is silicon and the like whose coefficient of thermal expansion is near that of the wafer, the generation of the image sensor does not cause the stress between the spacer and the semiconductor substrate and the spacer does not broken in the effect of the stress.

Further, since the through-holes are formed after sealing the image sensor, the productivity does not become lower. Furthermore, the sealing is complete in the size of the wafer, a movement accuracy of the semiconductore substrate and the positioning accuracy in XYZ directions can be extremely improved. In this case, even when the solid state imaging device is loaded on a camera module and the like on the basis of the outer shape, it is not necessary to adjust the position of image pick-up.

BRIEF DESCRIPTION OF THE DRAWINGS

The above objects and advantages of the present invention will become easily understood by one of ordinary skill in the art when the following detailed description would be read in connection with the accompanying drawings.

FIG. 4 is a table of a production process of the solid state imaging device;

FIGS. 7A-7D are partially sectional views of the wafer and the glass substrate in joining and the wafer after the backgrind;

FIGS. 9A-9E are sectional views illustrating a process for forming a bump on an assembly substrate and assembling the imaging chip on the assembly substrate;

FIG. 12 is a table of production processes of the solid state imaging device of FIG. 10;

FIG. 15 is a table of production processes of the solid state imaging device of the prior art;

PREFERRED EMBODIMENTS OF THE INVENTION

Figure 1:
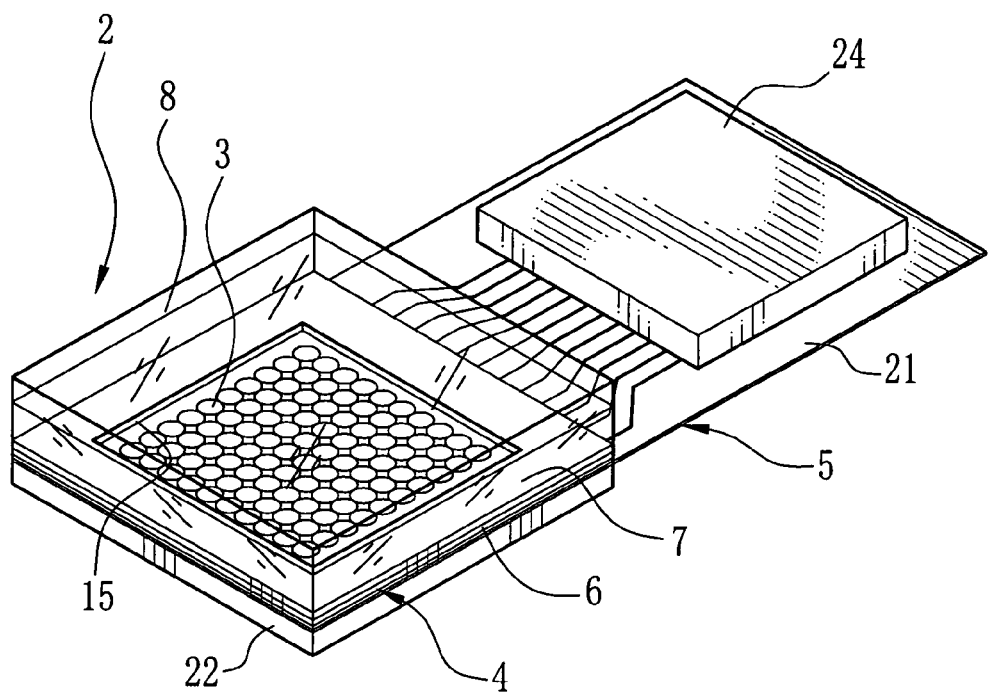
FIG. 1 is a perspective view of a solid state imaging device of the present invention.
Figure 2A:
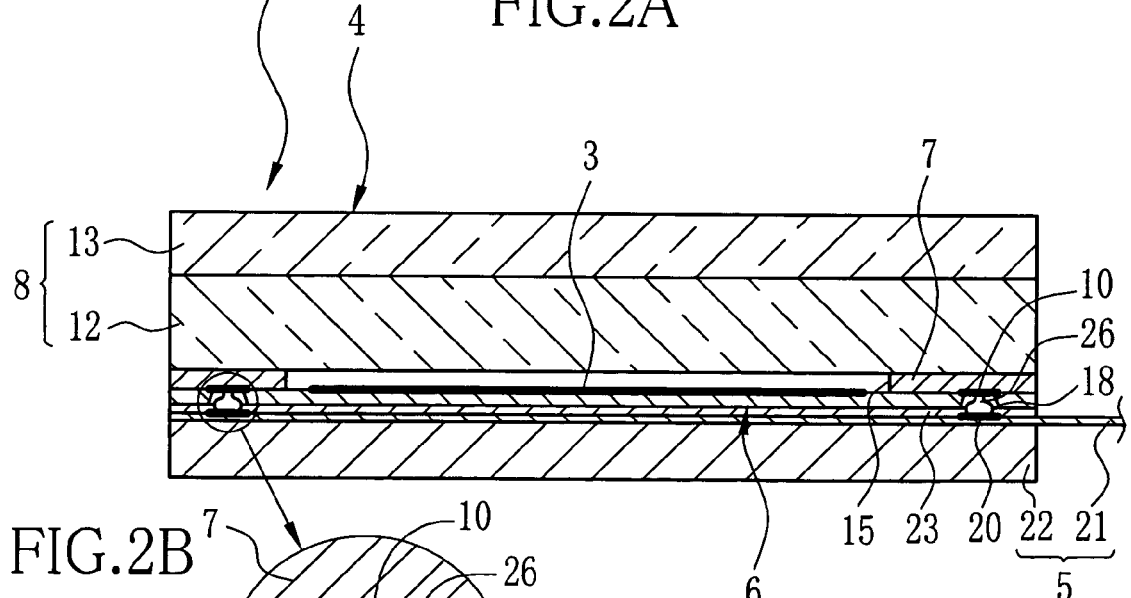
FIGS. 2A&2B are partially sectional views of the solid state imaging device.
Figure 2B:
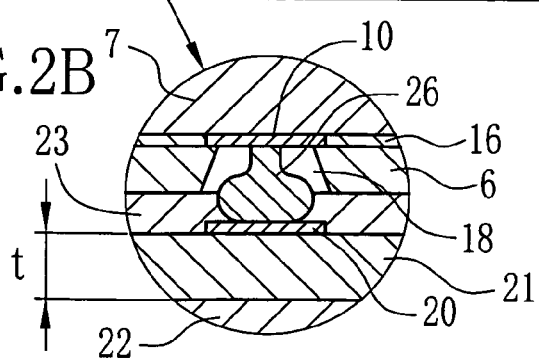
Figure 3:
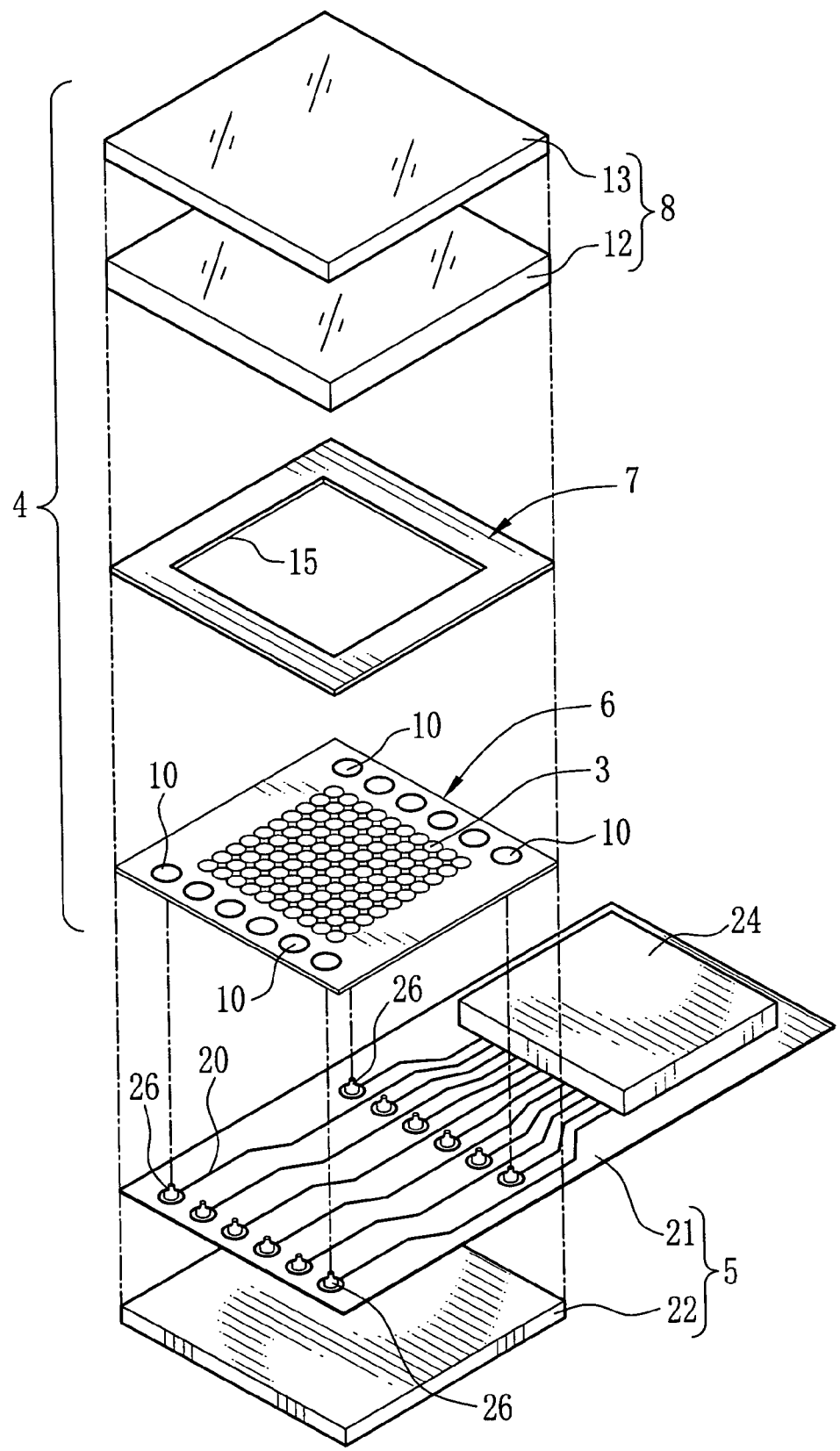
FIG. 3 is a exploded perspective view of the solid state imaging device.

In FIGS. 1-3, the solid state imaging device 2 has a WLCSP structure and is constructed of a rectangular imaging chip 4 which is provided with image sensors 3 and an assembly substrate 5 on which the imaging chip 4 is assembled. The imaging chip 4 includes a semiconductor substrate 6 on whose upper face the image sensors 3 are formed, a frame-like spacer 7 which is attached onto the semiconductor substrate 6 so as to surround the image sensors 3, and a cover glass 8 as a translucent member or a translucent substrate. The cover glass 8 is disposed above the spacer 7 so as to tightly close the image sensors 3.

The semiconductor substrate 6 is obtained by dividing a silicon wafer so as to have a rectangular shape, and has the image sensors 3 in a central area of an upper face and plural contact terminals 10 arranged on the confronting two edges. The thickness t of the semiconductor substrate 6 is decreased, for example in the range of 30 μm to 100 μm, and preferably to about 50 μm, which is effective for decreasing the thickness of the solid state imaging device 2. Further, when the semiconductor substrate 6 becomes thinner, the length of wires becomes shorter. Accordingly, the responding speed of the solid state imaging device becomes higher.

The image sensors 3 are, for example, constructed of plural pixels arranged in matrix form, a charge coupled device (CCD) for transporting an electric charge accumulated in the pixels. A micro lens or RGB color filters are superimposed on each pixels. Each contact terminal 10 is formed of aluminum and positioned on an upper face of the semiconductor substrate 6 so as to electrically connect the image sensors 3.

The cover glass 8 is constructed of a low-α-ray glass 12, and an IR-cut filter 13 which is joined on the low-α-ray glass 12. The low-α-ray glass 12 is a glass from which only a small intensity of α-ray is generated, so as to prevent that the pixels of the image sensors 3 is destroyed by the α-ray. The IR-cut filter 13 cuts the infrared ray in the predetermined wavelength range so as to prevent a ghost and fogging. On the IR-cut filter is superimposed a low-path filter for preventing the occurance of false color. Since the low-α-ray glass 12 and the IR-cut filter 13 are integrated, the attachment space becomes smaller and the attachment operations become easier.

The spacer 7 has an opening 15 in the center to have a frame-like shape, and is adhered onto the upper face of the semiconductor substrate 6 with an adhesive agent 16 so as to surround the image sensors 3. The spacer 7 is formed of inorganic materials whose coefficient of thermal expansion is closed to that of the semiconductor substrate 6, for example, silicon, stainless and the like. The disposition of the spacer 7 forms a space between the image sensors 3 and the cover glass 8. Since the space prevents the interference of the cover glass 8 to a micro lens of the image sensors 3, the functions of the micro lens don't become worse. Further, since the spacer 7 can seal the contact terminals 10 all together, the width of sealing can be larger than when only the image sensors 3 is sealed. Thus the effects of sealing becomes higher.

Plural through-holes 18 are formed on the lower face side of the semiconductor substrate 6 at the position to confront the contact terminals 10. Through each through-hole 18, the contact terminal 10 appears on the lower face of the semiconductor substrate 6. The through-hole 18 has a nearly corn like shape such that the diameter of the top may be φ0.1 mm, and that of the bottom may be φ0.12 mm.

The assembly substrate 5 is constructed of a flexible printed circuit board 21 and a reinforcement plate 22. On the flexible printed circuit board 21 is formed an interconnection circuit pattern 20 as a pattern of a periphery circuitry. On the interconnection circuit pattern, the imaging chips 4 are assembled and reinforced by the reinforcement plate 22. A diebond of the imaging chips 4 on the assembling substrate 5 is made with an insulating adhesive agent (or non-conductive resin paste) 23 applied to the flexible printed circuit board 21, and an IC 24 (for example DSP) and the like are assembled on the flexible printed circuit board 21 in which several sorts of circuits for driving the imaging chips 4 are incorporated There are formed plural stud bumps (hereinafter, bumps) on the interconnection circuit pattern 20 on the upper surface of the flexible printed circuit board 21. Each bump is formed of gold (Au) and has a diameter of φ0.06 mm and a height of 0.08 mm. When the imaging chip 4 are assembled on the assembly substrate 5, a stud bump 26 enters in the through-hole 10 of the semiconductor substrate 6 to contact to the contact terminal 10 for electrically connecting the imaging chips 4 and the flexible printed circuit board 21.

Thus in the imaging device 2 of the present invention, the bump 26 is used for forming the connect terminal in a side of the bottom instead of using through-hole interconnections, and therefore many processes of high cost that are necessary for forming the through-hole interconnections are omitted. Further, the defective interconnection caused by the voids in the through-hole interconnections is prevented, and therefore it is prevented that the image quality of the solid state imaging device 2 becomes lower.

A producing method of the solid state imaging device 2 will be explained with reference to FIG. 4 as a table in which operation steps in the producing process of the solid state imaging device 2, concrete works in each operation, and treatments of each work are described. As the treatments, there are a high-temperature treatment performed under the high temperature, a vacuum treatment performed in vacuum, and a wet treatment performed with use of liquid. The performed treatment checked and marked with an asterisk.

Figure 5:
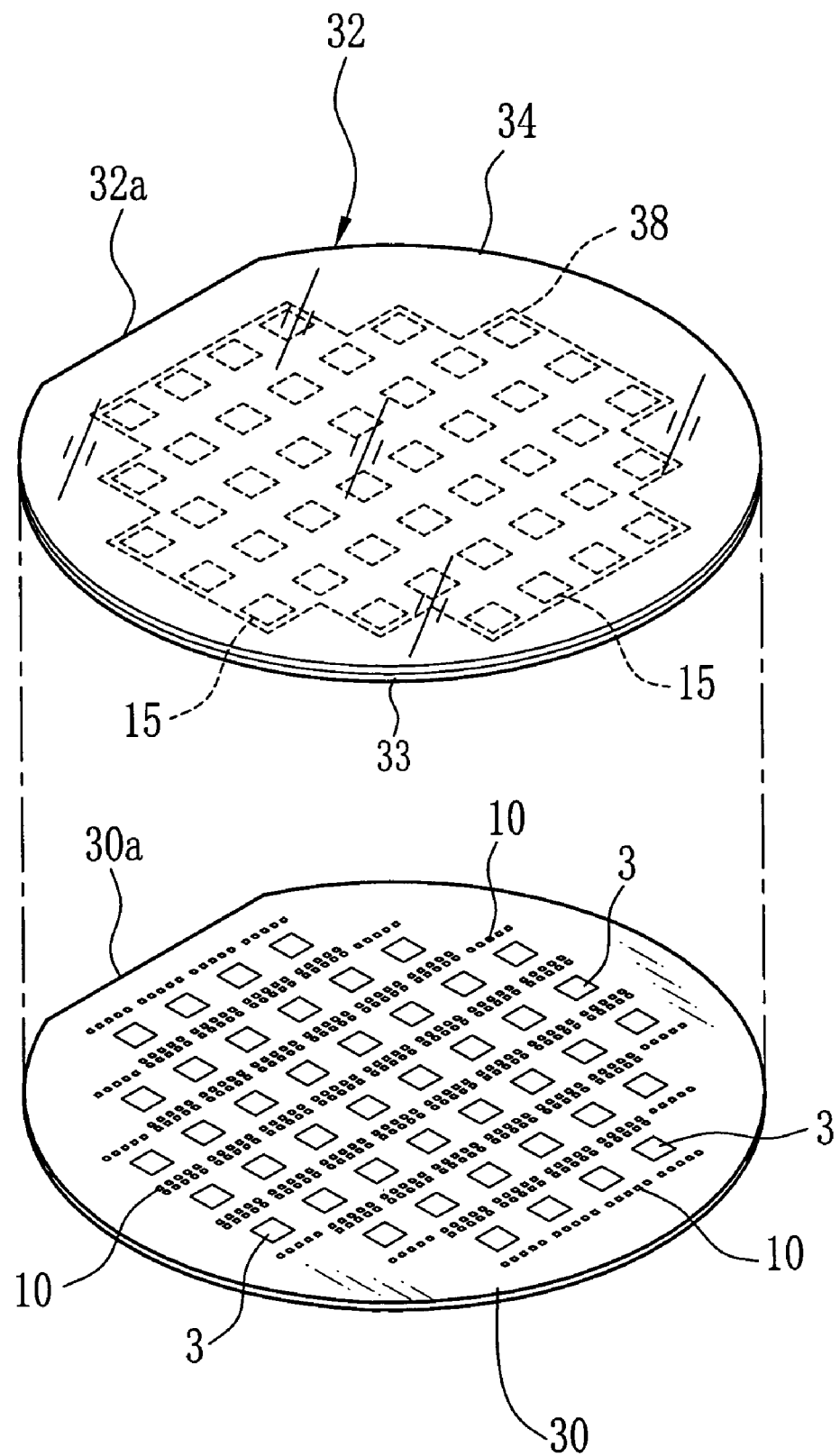
FIG. 5 is a perspective view of a wafer and a glass substrate.

In the first operation, the joining the wafer and the glass substrate is made. As shown in FIG. 5, the wafer 30 is obtained by forming many image sensors 3 and the contact terminals 10 on a well-known silicone wafer. The wafer 30 may be a standard wafer which is cheap and widely distributed. The standard wafer has a diameter of φ6 inch and a thickness of 625 μm. Further, the glass substrate 32 includes a low-α-ray glass substrate 33 as a substrate for the low-α-ray glass 12, a filter substrate 34 as a substrate for the IR-cut filter 13 and a spacer 38 as a substrate of the spacer 7.

Figure 6A:
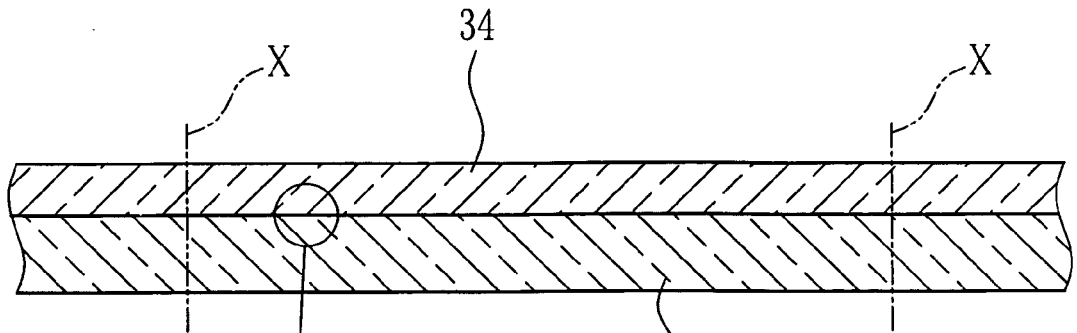
FIGS. 6A-6D are partially sectional views of a glass substrate in a production process.
Figure 6B:
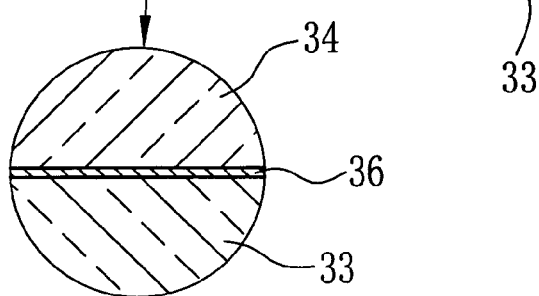

The glass substrate 32 is produced in another line than the production line for the solid state imaging device 2, and supplied into the production line for the solid state imaging device 2. As shown in FIGS. 6A&6B, the low-α-ray glass substrate 33 and the filter substrate 34 are joined at first. In the performance of the joining, for example, an UV-adhesive agent 36 is applied to the low-α-ray glass substrate 33 with a constant thickness, the filter substrate 34 is superimposed thereon, and the vacuum pressing is made to tightly adhere the both. Thereafter, an UV-lay is irradiated to the UV-adhesive agent 36 through the filter substrate 34 to make the hardening. Note that the double dashed lines X in the FIGS. 6A&6C illustrate positions for cutting the joined wafer 30 and the glass substrate 32 into the image sensors 3.

Figure 6C:
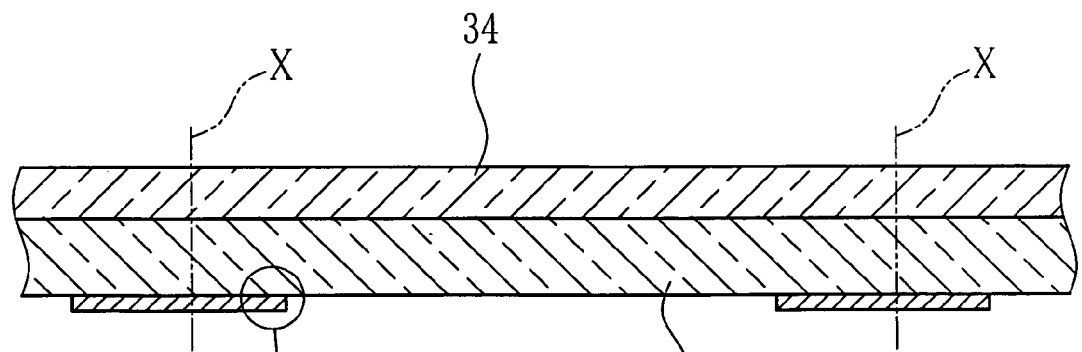
Figure 6D:
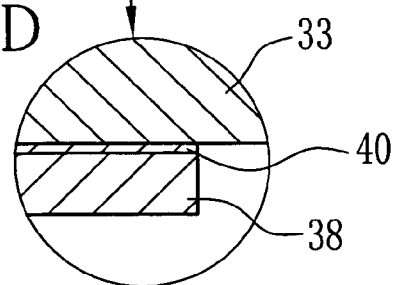
Figure 7A:
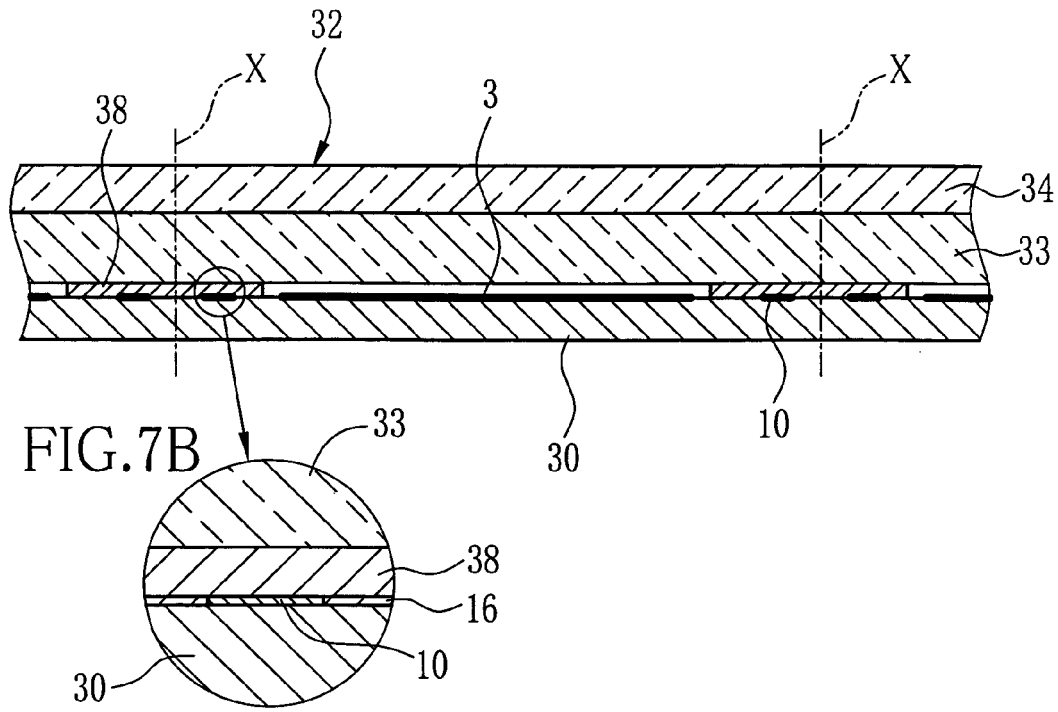

As shown in FIGS. 6C&6D, the spacer 38 is joined with the adhesive agent 40 to a lower face of the low-α-ray glass substrate 33. On the spacer 38 joined on the low-α-ray glass substrate 33, a resist mask having the same shape as the spacer 7 is formed by the photolithography. On a part which is not covered by the resist mask, a plasma etching is made such that many openings may be formed. After the etching, the resist mask is removed by an ashing and the like As shown in FIGS. 7A&7B, the glass substrate 32 is superimposed on the wafer 30 and joined with the adhesive agent 16 applied to the spacer 38. In the adhesion of the glass substrate 32 to the wafer 30, alignment adhering device is used. The alignment adhering device makes the positioning adjustment between the wafer 30 and the glass substrate 32 in the X-Y directions while orientation flats 30*a*, 32*a* are the standards thereby, and the pressure is applied so as to adhere the wafer 30 and the glass substrate 32 adequately. Since the imaging elements on the wafer 30 are sealed by the joint of the spacer 38 and the glass substrate 32, the dusts generated in the following operations does not adhere to the image sensors 3.

The adhesive agent 16 used for joining the wafer 30 and the glass substrate 32 is, for example, a visible light delayed curing adhesive and the like in order to prevent the warpage in the hardening. Further, in order to form the adhesive layer whose thickness is thin and constant about several micrometers, the adhesive agent having the low viscosity is used.

Figure 7C:
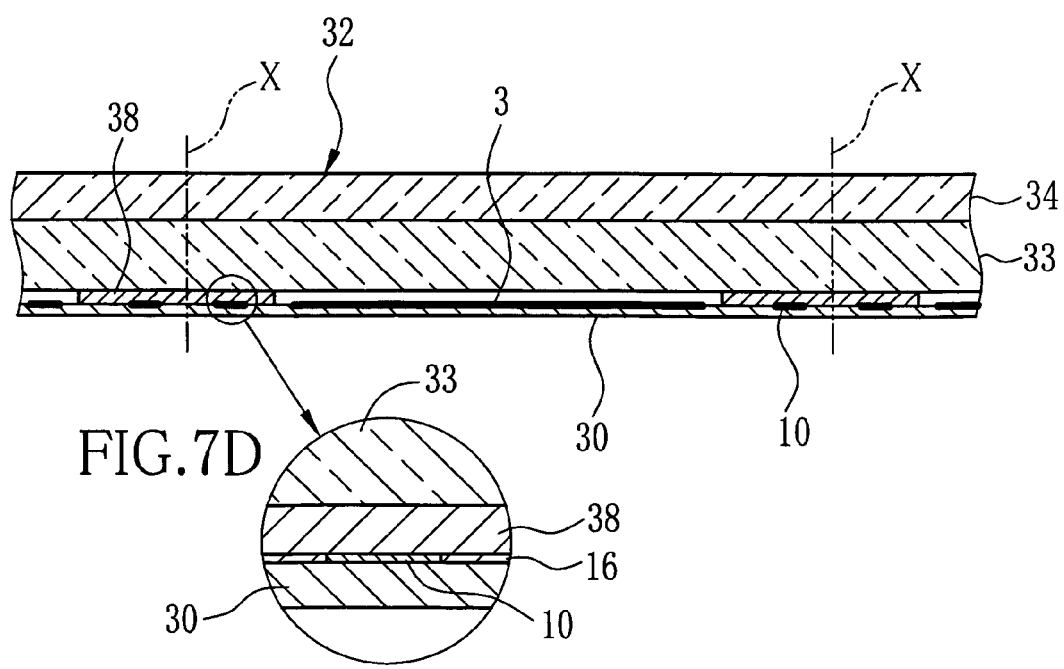

In the second operation, as shown in FIGS. 7C&7D, the wafer is made thinner. The wafer 30 is adhered to a protective tape such that scratches may not formed on the glass plate 32 which is joined on the upper face of the wafer. Then the wafer 30 is set to a backgrind device for grinding the bottom of the wafer. In the backgrind device, the water is sourced over the wafer 30 in order to prevent the temperature increase. After the grinding, the polishing is performed so as to make the surface of the wafer 30 flat. In this operation, the thickness of the wafer 30 is decreased from 625 µm to the range of 30-100 µm, and preferably to 50 µm.

When the wafer 30 becomes thinner, the thickness of the solid state imaging device 2 can become smaller. Further, the grinding and polishing are performed to the single body of the wafer 30 before the joining, the strength thereof becomes lower, and therefore the handling and the like become more difficult. However, when the grinding and polishing is made after the joining to the glass substrate 32, the glass substrate 32 reinforces the wafer. Accordingly the handling characteristics of the wafer 30 don't become worse.

Figure 8A:
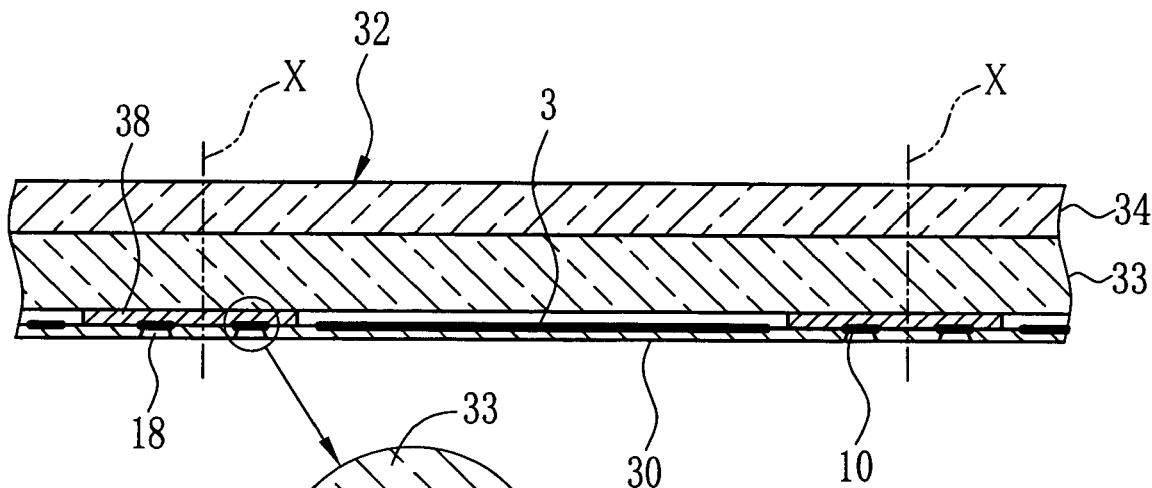
FIGS. 8A-8C are partially sectional views illustrating a process of forming through-holes in wafer and an imaging chip after dancing.
Figure 8B:
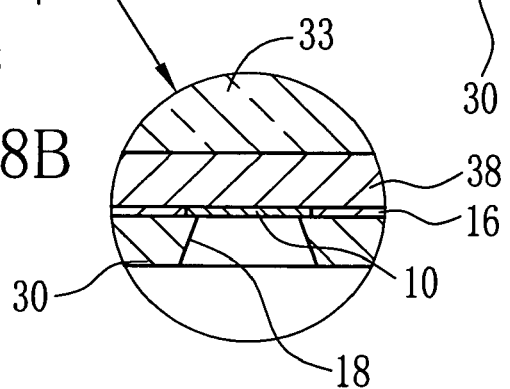
Figure 8C:
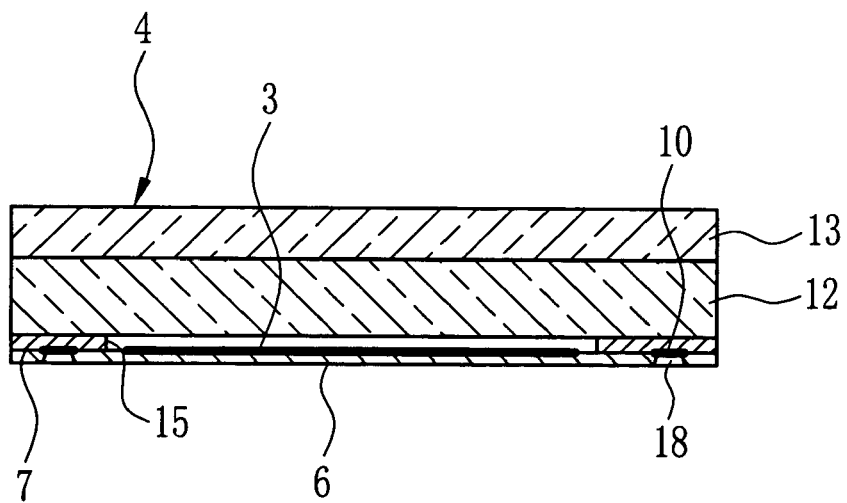

As shown in FIGS. 8A-8C, the through-holes 18 are formed in the wafer 30 in the third operation. At first, the resist mask is formed by the photolithography on the bottom of the wafer 30 except of the positions where the through-holes 18 are formed. The formation of the resist mask is performed by the wet treatment in which the developing liquids and the like are used. Then the plasma etching is made from the bottom side of the wafer 30, and part of the wafer that is not coated with the resist mask is removed. The plasma etching is performed under the vacuum circumstance. Thus the plural through-holes are formed from the bottom of the wafer 30 to the contact terminal 10. The resist mask is removed by the ashing which is performed in the vacuum condition or the high temperature condition.

The formation of the through-hole 18 is completed in a short time since the thickness of the wafer 30 is made smaller in the previous process, and therefore the workability is increased. Further, the plasma etching is completed in a short time, the generation of the side etch is prevented.

As shown in FIG. 8C, the wafer 30 joined with the glass substrate 32 is cut into the image sensors 3 on the double dashed line X in the fourth operation. After the dicing tape is applied to the glass substrate 32, the wafer 30 is set to a dicing device. The dicing device cools the wafer with sourcing water, and divides the joined wafer 30 and glass substrate 32 with use of metal resin grind stone which is made from coagulating diamond grinding sands with resin. Thus the imaging chip 4 is obtained.

The thickness decrease by the backgrind device and the cut by the dicing device are made with high accuracy. Accordingly, the movement accuracy of the image sensors 3 to the outer shape of the imaging chip 4, the positional accuracies in the XYZ directions are extremely high. Further, the bottom and the side face of the imaging chip 4 can be used enough as a standard face of the positioning even without additional processing. Thus the imaging chip 4 can be assembled into a camera module and the like based on the outer shape of the imaging chip 4, and the adjusting operation (such as the position adjustment) which takes long time can be omitted.

As shown in FIGS. 9A & 9B, many bumps 26 are formed on the interconnection circuit pattern 20 of the flexible printed circuit board 21 in the fifth operation. The bump 26 is formed in the following steps. At first, a gold wire as the raw materials of the bump 26 is supplied by a wire bonder, and the electric discharge with high voltage is made to the gold wire in the moment. Thus the gold wire is melt and solidified in this moment to form a gold ball on the top of the gold wire. The gold ball is disposed on the interconnection circuit pattern 20, and then melt by the supersonic wave adhesion. At last the gold wire is broken to form the bump 26.

As shown in FIGS. 9C-9E, the imaging chip 4 is assembled onto the assembly substrate 5 in the sixth operation. First, a non conductive resin paste (or NCP) 23 is applied onto the flexible printed circuit board 21, and then the imaging chip 4 is disposed on the flexible printed circuit board 21. Each bump 26 is inserted into the through-hole 18 to contact to the contact terminal 10. At last, the non-conductive resin paste 23 is solidified by heat, such that the assembly of the imaging chip 4 on the assembly substrate 5 is completed. Thus the solid state imaging device 2 is obtained.

As described above, according to the producing method of the solid state imaging device, since the through-hole interconnection is not formed, the many operations of the etching are omitted. Further, since the wafer to which the etching is performed has the smaller thickness, the time for the etching becomes one sixth shorter than the prior art. Further, the number of the steps in all of the vacuum treatment, the high-temperature treatment and the wet treatment is one third fewer than the prior art. Thus in the producing method of the solid state imaging device in the present invention, the production process (or the production cost) of the solid state imaging device 2 is one fourth decreased than the prior art.

Further, in the solid state imaging device 2, the imaging chip 4 is assembled on the assembly substrate 5. However, as explained in below, the interconnection circuit pattern may be formed on the bottom of the chip to be provided with a peripheral circuitry. Note that the detailed explanation for the same parts as the above embodiment is omitted.

Figure 10:
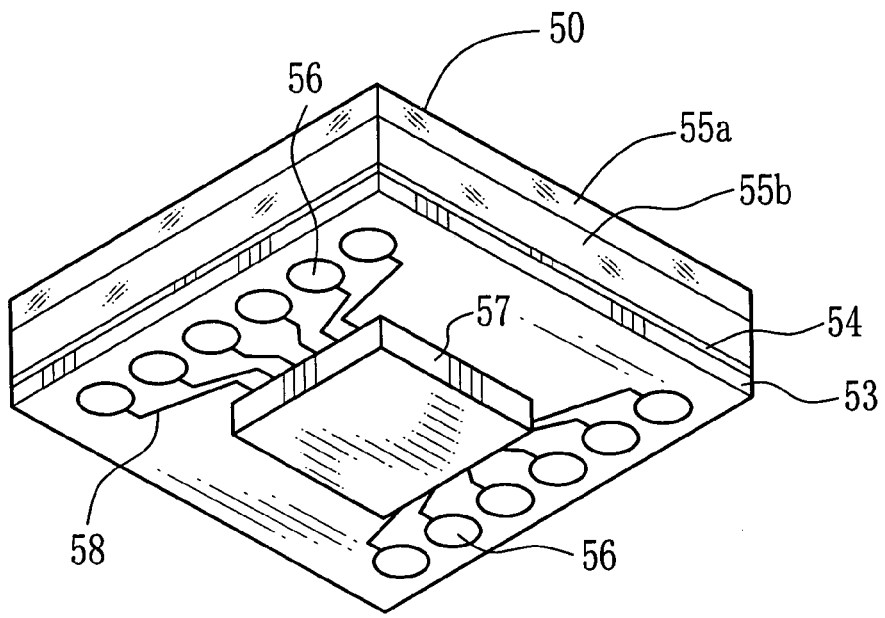
FIG. 10 is a perspective view of another embodiment of the solid state imaging device.
Figure 11A:
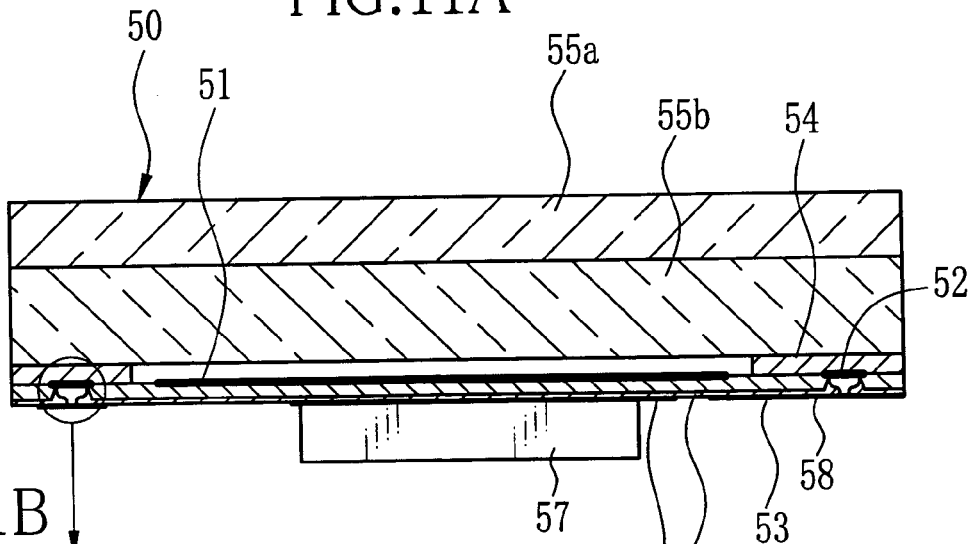
FIGS. 11A-11B are partial sectional views of the solid state imaging device of FIG. 10.
Figure 11B:
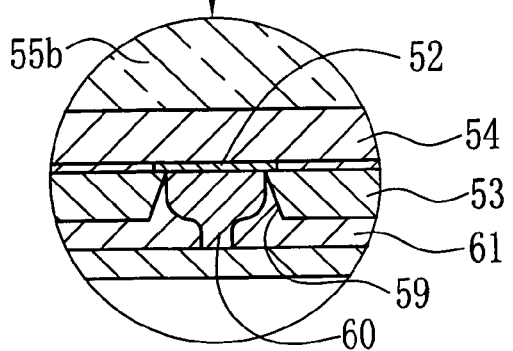

In FIGS. 10, 11A&11B, a solid state imaging device 50 includes a semiconductor substrate 53, a frame-like spacer 54, cover glasses 55a, 55b, a connection terminal 56, and an interconnection circuit pattern 58. On the semiconductor substrate 53 are formed plural imaging elements 51 and plural contact terminals 52. The frame-like spacer 54 is attached onto the semiconductor substrate 53 so as to surround the imaging elements 51, and the cover glasses 55a, 55b are disposed above the spacer 54 so as to seal the imaging elements 51. Below the interconnection circuit pattern 58 is assembled an IC 57 in which several sorts of circuits for driving the image sensor 51 are incorporated.

Through-holes 59 of nearly corn-like shape are formed on a lower face side of the semiconductor substrate 53 at the positions to confront the corresponding contact terminals 52. Through each through-hole 59, the contact terminal 52 appears on the lower face of the semiconductor substrate 53.

In the through-holes 59, there are formed bumps 60 which re made of gold so as to project toward below. The bottom of he semiconductor substrate 53 is covered with an insulation layer 61 formed of the insulation adhesive agent, and an end of the bump 60 protrudes from the insulation layer 61. A lower face of the insulation layer 61 is provided with the connection terminal 56 and the interconnection circuit pattern 58, and the connection terminal 58 is electrically connected to the bump 60. Thus the IC 57 attached to the interconnection circuit pattern 56 is connected to the imaging elements 51.

Figure 13A:
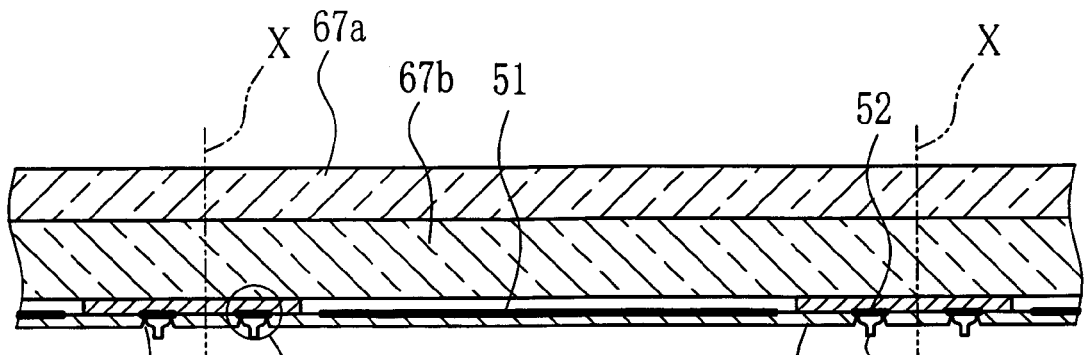
FIGS. 13A-13D are partially sectional views illustrating situations in which a bump is formed in through-holes of wafer constructing the solid state imaging device of FIG. 10.
Figure 13B:
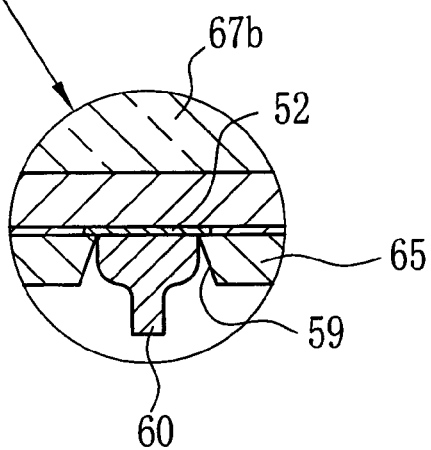
Figure 13C:
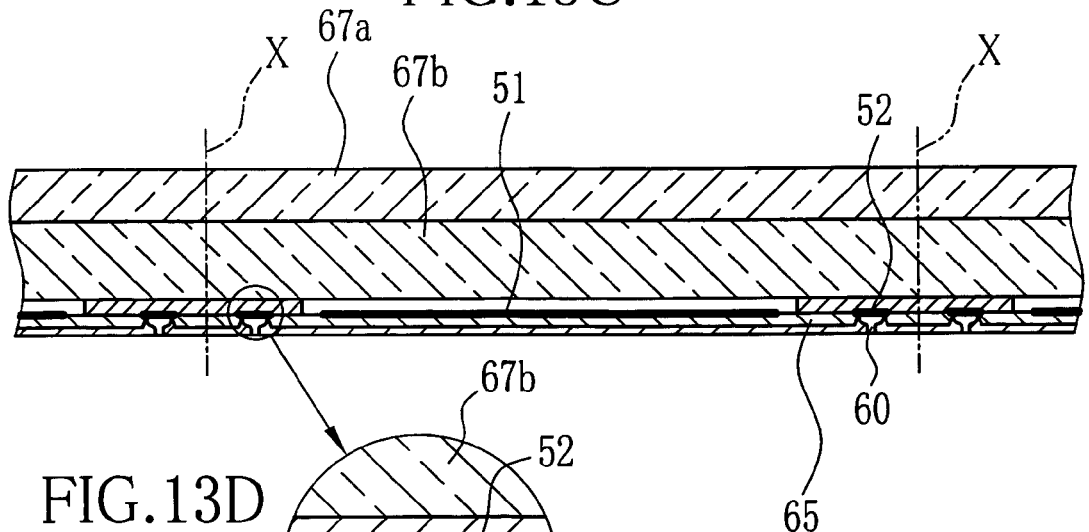
Figure 13D:
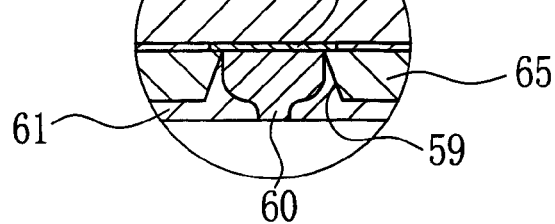
Figure 14A:
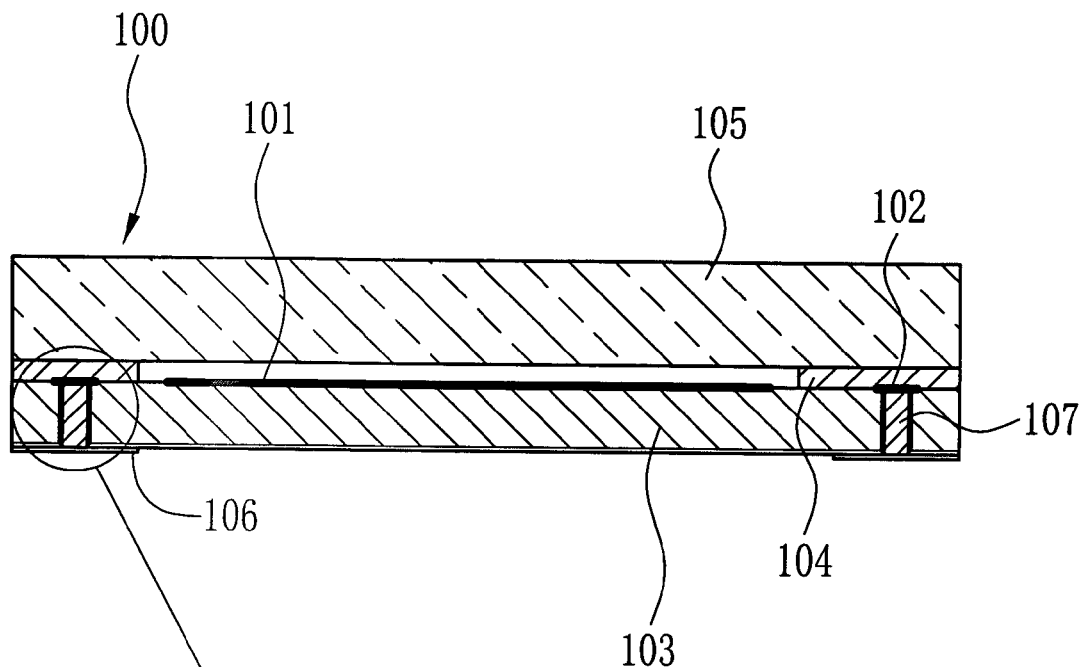
FIGS. 14A&14B are partially sectional views of a solid state imaging device of the prior art.
Figure 14B:
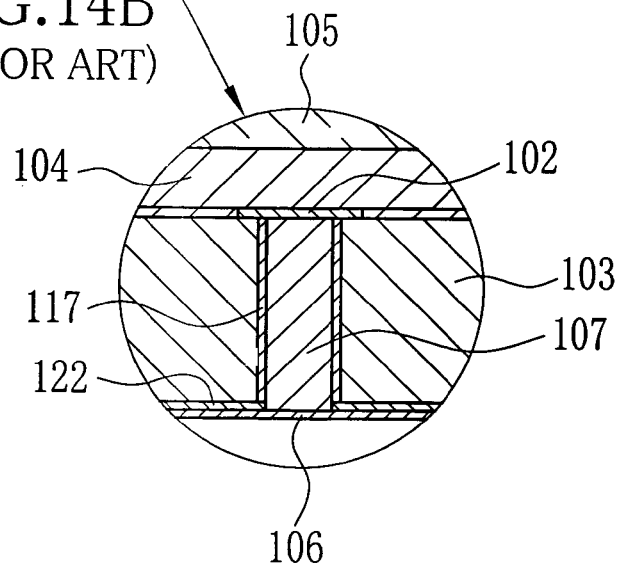
Figure 16A:
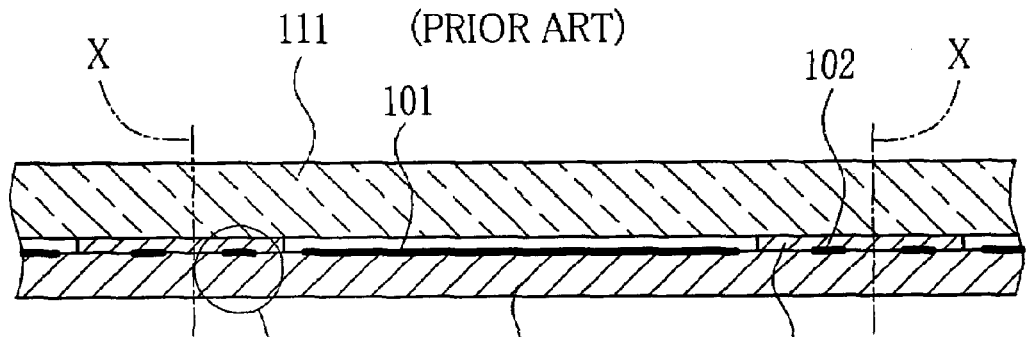
FIGS. 16A-16D are partially sectional views of wafers in which through-holes are formed in the solid state imaging device of the prior art.
Figure 16B:
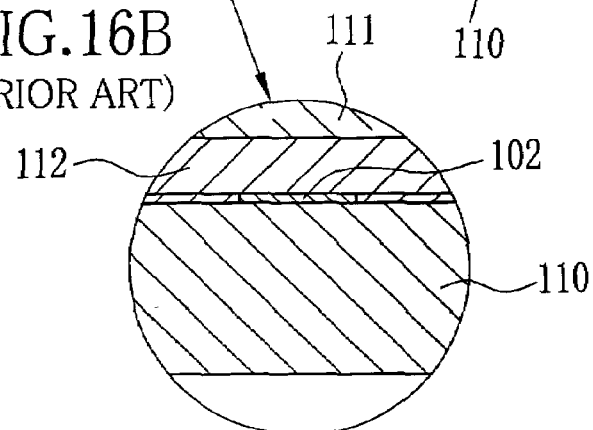
Figure 16C:
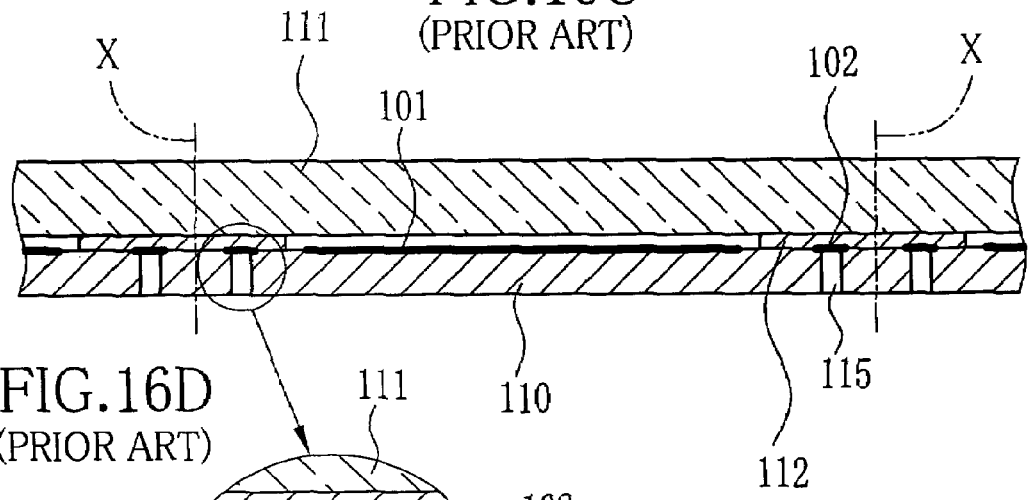
Figure 16D:
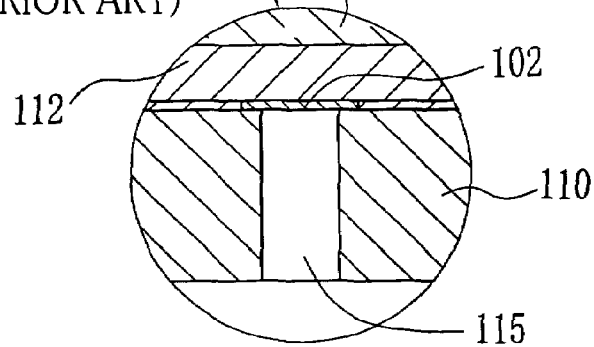
Figure 17A:
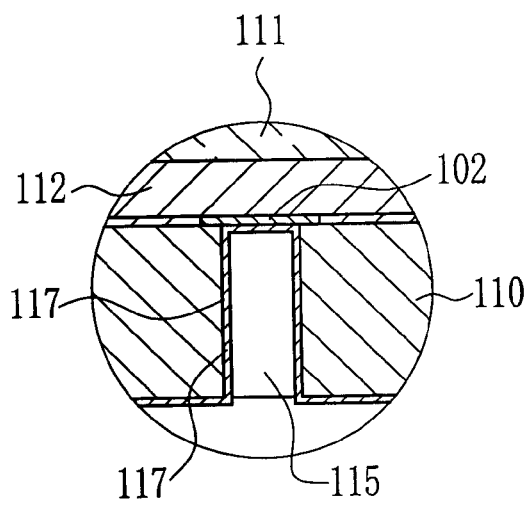
FIGS. 17A-17D are explanatory views illustrating processes for forming through-hole interconnections in through-holes of the solid state imaging device of the prior art.
Figure 17B:
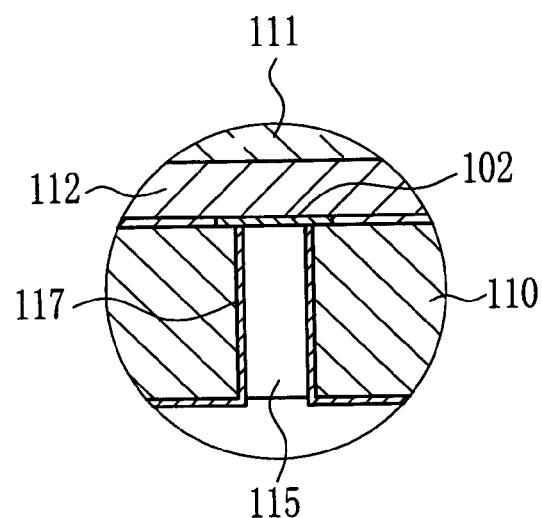
Figure 17C:
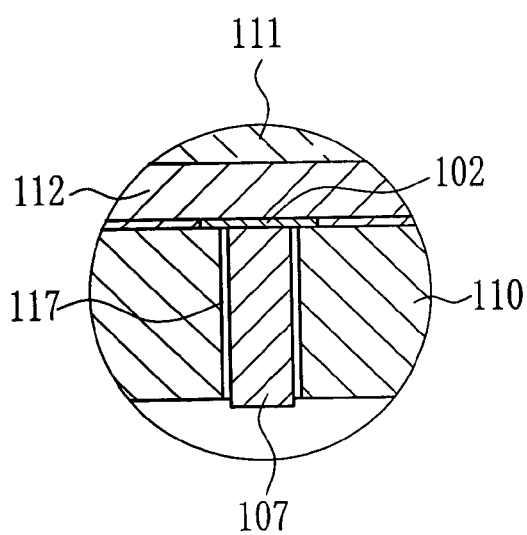
Figure 17D:
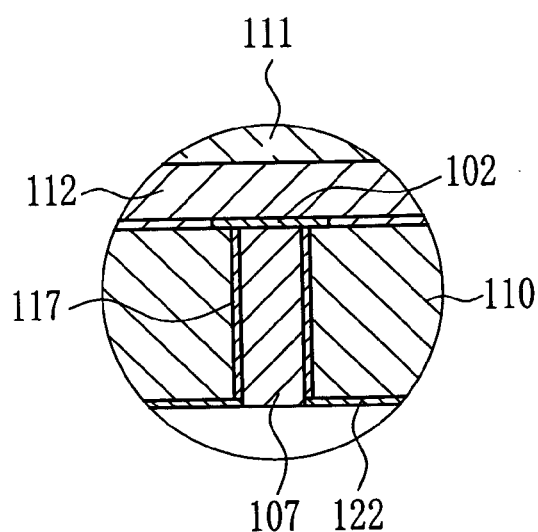

The producing method of the solid state imaging device 50 will be explained in reference with a table of FIG. 12. Note that since the first to third operations are the same as in the above described producing method of the solid state imaging device 2, the explanation thereof is omitted. As shown in FIGS. 13A&13B, the bump 60 is formed in the through-hole 59 of a wafer 65 in the fourth operation. As shown in FIGS. 13C&13D, the insulation adhesive agent is applied to the bottom of the wafer 65 and solidified to form the insulation layer 61 in the fifth operation. Further, the grinding and the polishing of the bottom side of the wafer is made by the backgrind device, such that an end of the bump 60 may protrude from the insulation layer 61.

As shown in FIG. 11, the interconnection circuit pattern 58 and the connection terminal 56 are formed on the bottom of the insulation layer 61 in the sixth operation. The formation thereof is made in the steps of forming a resist mask by a photolithography, plating in a liquid in which the bottom side of the semiconductor substrate 53 is dipped into the liquid, and removing the mask. In the last seventh operation, the dicing of the joined wafer 65 and glass substrates 67a, 67b is made, and thus the plurality of the solid state imaging device 50 is completely produced. On the bottom of each solid state imaging device 50 is attached the IC 57.

According to the solid state imaging device 50, since the through-hole interconnections are not used, the problems caused by the through-hole interconnections are solved similarly to the solid state imaging device 2 shown in FIG. 1. Further, a peripheral circuitry can be formed on the bottom of the semiconductor substrate 53, the assembly size of the solid state imaging device 50 is made smaller. Furthermore, the thickness t of the semiconductor substrate 53 is decreased to the range of 30 μm to 100 μm, and preferably to about 50 μm the same as that of the solid state imaging device 2 shown in FIG. 1. Therefore even when the IC 57 is formed on the bottom, the imaging apparatus 50 does not become extremely thick.

Further, since the through-hole interconnections are not used, the time for performing the etching is one fifth shorter than the solid state imaging device of the prior art. Furthermore, the number of the steps in all of the vacuum treatment, the high-temperature treatment and the wet treatment is reduced to half than the prior art. Thus in the producing method of the solid state imaging device in the present invention, the production process (or the production cost) of the solid state imaging device 2 is decreased to half of that in the prior art.

In the solid state imaging device 2, the bump 26 is formed on the assembly substrate 5. However, the bump may be formed in the through-hole 18 of the semiconductor substrate 6. Further, the through-holes are formed in the semiconductor substrate such that the connection terminal may expose. However, the through-holes may be formed in the cover glass such that the connect terminal may be exposed on upper face of the solid state imaging device. Further, in the solid state imaging device described above, all over the upper face of the semiconductor substrate is sealed by the cover glass. However, the present invention can be applied to the solid state imaging device in which only a space on the imaging sensors may be sealed by the cover glass and the contact terminal on the semiconductor substrate is exposed.

Further, in each above embodiment, the CCD is used as the solid state imaging device. However, the present invention can be applied to the solid state imaging device of the CMOS type. Further, in this description of the present invention, an example of the solid state imaging device is the WLCSP type. However, the present invention can be applied to the solid state imaging device of the CSP type or bare chip assembly type. Further, the present invention can be applied to a semiconductor device other than the solid state imaging device.

Various changes and modifications are possible in the present invention and may be understood to be within the present invention.

What is claimed is:

1. A solid state imaging device comprising:
   a semiconductor substrate having a first face and a second face, in said first face being formed image sensors and plural contact terminals connected to said respective image sensors, said each contact terminal appearing on said second face through said through-hole formed by piercing said semiconductor substrate from a side of said second face;
   a translucent member superimposed on said first face of said semiconductor substrate so as to seal said image sensors and said contact terminals;
   an assembly substrate for assembling said semiconductor substrate thereon; and
   plural bumps formed in at least one of said semiconductor substrate and said assembly substrate, so as to connect said contact terminal in said each through-hole to said assembly substrate.

2. A solid state imaging device as described in claim 1, wherein a space is formed between said image sensors and said translucent member.

3. A solid state imaging device as described in claim 1, wherein said translucent member is one of a low-α-ray glass, IR-cut filter and a low path filter.

4. A solid state imaging device as described in claim 1, further comprising a spacer disposed between said translucent member and said semiconductor substrate.

5. A solid state imaging device as described in claim 4, wherein a raw material of said spacer is one of stainless and silicon.

6. A solid state imaging device as described in claim 1, wherein said semiconductor substrate is from 30 to 100 μm in thickness.

7. The device of claim 1 wherein said through-hole has a first end disposed near the contact terminal and a second end disposed near the assembly substrate, wherein the first end and the second end have different diameters.

8. The device of claim 7, wherein the first diameter is smaller than the second diameter.

9. The device of claim 1, wherein the semiconductor substrate has a thickness and the plural bumps are disposed within the thickness of the substrate.

* * * * *